United States Patent [19]

Hebenstreit

[11] Patent Number: 4,461,966
[45] Date of Patent: Jul. 24, 1984

[54] CIRCUIT FOR CONTROLLING AT LEAST ONE POWER-FET

[75] Inventor: Ernst Hebenstreit, Munich, Fed. Rep. of Germany

[73] Assignee: Siemens Aktiengesellschaft, Berlin and Munich, Fed. Rep. of Germany

[21] Appl. No.: 326,433

[22] Filed: Dec. 1, 1981

[30] Foreign Application Priority Data

Dec. 4, 1980 [DE] Fed. Rep. of Germany ....... 3045771
May 29, 1981 [DE] Fed. Rep. of Germany ....... 3121508

[51] Int. Cl.³ .................... H03K 17/00; H03K 17/56
[52] U.S. Cl. .................... 307/571; 307/246; 307/270; 307/282
[58] Field of Search .......... 307/571, 282, 132 E, 307/132 R, 140, 572, 300, 200 B, 549, 246, 270

[56] References Cited

U.S. PATENT DOCUMENTS 3,566,158  2/1971  Paine ............................ 307/300
3,805,094  4/1974  Orlando ......................... 307/300
4,052,623 10/1977  Loberg .......................... 307/571

OTHER PUBLICATIONS

Periodical, "Siemens Components", 18, (1980), Issue 4, p. 198 et seq.

Primary Examiner—John S. Heyman
Assistant Examiner—Timothy P. Callahan
Attorney, Agent, or Firm—Herbert L. Lerner; Laurence A. Greenberg

[57] ABSTRACT

Circuit for controlling at least one power-FET, including a transformer having a primary and a secondary winding, a control input connected to the primary winding, a first terminal of the secondary winding connected to the gate electrode of the FET, at least one diode connected between the first terminal of the secondary winding and the gate electrode of the FET, a second terminal of the secondary winding connected to the source of the FET, a differential member connected between the control input and the primary winding, and a switch connected between the secondary winding and the gate electrode of the FET, the switch connecting the gate electrode of the FET to the first terminal of the secondary winding in the case of a given secondary signal of a first polarity, and the switch connecting the gate electrode of the FET to the source electrode of the FET in the case of a given secondary signal of a second polarity.

10 Claims, 6 Drawing Figures

CIRCUIT FOR CONTROLLING AT LEAST ONE POWER-FET

The invention relates to a circuit for controlling at least one power-FET, having a transformer with a primary winding connected to a control input and a secondary winding having terminals, one of the terminals being connected to the FET (Field Effect Transistor) gate electrode through at least one diode, and the other terminal being connected to the FET source electrode.

Such a circuit has been described, for example, in the periodical "SIEMENS Components" 18 (1980), issue 4, p. 187 et seq. The primary winding in that device is part of a blocking oscillator, the output voltage of which is applied across the gate and source electrodes of a power-FET by means of a diode. With the blocking oscillator oscillating, there are positive control pulses fed through the diode to the gate electrode, the positive control pulses charging up the FET input capacitance, which is applied across the gate and source electrodes, and thus conductively controlling the FET. When cutting out the blocking oscillator by interrupting the input voltage, the FET is switched off after the input capacitance has discharged itself through a resistor to a voltage level set below the cutoff voltage. In that way the cutout speed of the FET cannot be affected by external sources.

The feasibility of feeding a sequence of square-wave pulses to the FET input could be considered in this case, where with an n-channel FET the positive slope switches the FET on and the negative slope switches the FET off. However, with a transformer coupling, the magnetization current produces matching losses in the transformer and problems arise involving the elimination of built up magnetic energy in the transformer.

It is accordingly an object of the invention to provide a circuit for controlling at least one power-FET, which overcomes the hereinafore-mentioned disadvantages of the heretofore-known devices of this general type, and which makes both a controlled switch-in and a controlled switch-off of the power-FET feasible, but with a transformer-converted power dissipation minimized thereby.

With the foregoing and other objects in view there is provided, in accordance with the invention, a circuit for controlling at least one power-FET, comprising a transformer having a primary and a secondary winding, a control input connected to the primary winding, a first terminal of the secondary winding connected to the gate electrode of the FET, at least one diode connected between the first terminal of the secondary winding and the gate electrode of the FET, a second terminal of the secondary winding connected to the source of the FET, a differential member connected between the control input and the primary winding, and a switch connected between the secondary winding and the gate electrode of the FET, the switch connecting the gate electrode of the FET to the first terminal of the secondary winding in the case of a given secondary winding signal of a first polarity applied to the input, and the switch connecting the gate electrode of the FET to the source electrode of the FET in the case of a given secondary signal of a second polarity.

In accordance with another feature of the invention, the switch includes a transistor having a load path connected between the gate and the source electrodes of the FET, and a capacitor having one terminal connected to the source electrode of the FET and another terminal connected to the control or base terminal of the transistor, and a Zener diode connected between the first terminal of the secondary winding and the base terminal of the transistor, the diode and Zener diode being poled or biased in the conducting direction for the secondary signal of the first polarity.

In accordance with a further feature of the invention, the switch includes another transistor complementing the first-mentioned transistor, the other transistor having a load path being connected between the diode and the gate electrode of the FET and being connected in series with the load path of the first-mentioned transistor, the bases of the transistor being connected to each other, and another capacitor connected in parallel with the series-connected load paths of the transistors.

In accordance with an added feature of the invention, the transistor is a bipolar transistor or an FET.

In accordance with an additional feature of the invention, the transistors are complementary bipolar transistors being connected as a complementary emitter follower.

In accordance with again another feature of the invention, the transistors are complementary FETs being connected as a complementary source follower.

In accordance with again a further feature of the invention, the control input includes at least one terminal, and the differential member includes two capacitors each having one terminal connected to the same terminal of the control input and each having another terminal, and first and second complementary transistors having base terminals each being connected to a different one of the other terminals of the capacitors and having collector and emitter terminals, the primary winding being subdivided into a first and a second partial winding being wound in mutually opposite directions and each having a start and an end, the start of the first partial winding being connected to the emitter of the first transistor, the start of the second partial winding being connected to the emitter of the second transistor, the end of the first partial winding being connected to the collector of the second transistor, and the end of the second partial winding being connected to the collector of the first transistor.

In accordance with again an added feature of the invention, the secondary winding of the transformer is subdivided into two partial windings being wound in mutually opposite directions, and the at least one FET is in the form of two series-connected FETs, and including another switch, each of the switches being connected between one of the partial windings and one of the FETs, and a load having a terminal connected to ground and another terminal connected to the drain electrode of one FET and/or the source electrode of the other FET.

In accordance with a concomitant feature of the invention, the secondary winding of the transformer is subdivided into two partial windings being wound in the same direction, and the at least one FET is in the form of two series-connected FETs, and including another switch, each of the switches being connected between one of the partial windings and one of the FETs, and a load connected to the source of the first-mentioned FET.

Other features which are considered as characteristic for the invention are set forth in the appended claims.

Although the invention is illustrated and described herein as embodied in a circuit for controlling at least one power-FET, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
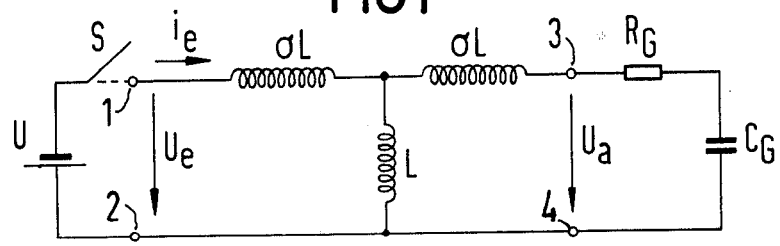
FIG. 1 is a schematic circuit diagram of a transformer.

Referring now to the figures of the drawing and first particularly to FIG. 1 thereof, there is seen an equivalent-circuit diagram of a transformer or translator, having primary and secondary stray inductances $\sigma L$ and a shunt inductance L. When feeding an input voltage $U_e$ to input terminals 1, 2 by closing a switch S, a current $i_e$ flows by inducing a secondary voltage $U_a$, which is applied across the output terminals 3, 4. This voltage is the control voltage of the power-FET, which is symbolized by the resistor $R_G$ and the input capacitance $C_G$. With a charged-up input capacitance $C_G$, the current $i_e$ flows on through the primary stray inductance $\sigma L$ and the shunt inductance L as a magnetizing current $$i_e = \frac{1}{L(1+\sigma)} \cdot U \cdot t;$$

$i_e$ then is directly proportional to time t with reference to the switch-in timed point of the voltage U. However, as mentioned above the magnetization current produces matching losses in the transformer. Furthermore, problems are generated involving the elimination of the magnetic energy built up in the transformer.

Figure 2:
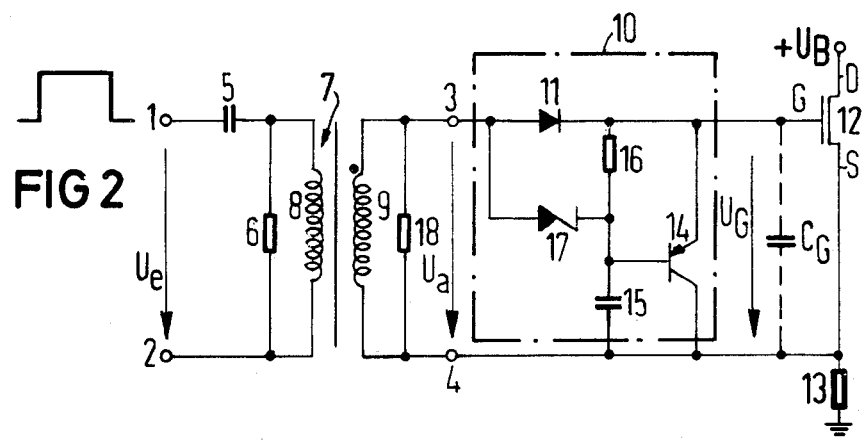
FIG. 2 is a circuit diagram of a first embodiment of the invention.

FIG. 2 shows a circuit for controlling a power-FET, which includes a translator or transformer 7 having a primary winding 8, a secondary winding 9, a primary-sided differential or difference member, and a secondary-sided switch 10 consisting of the components embraced by the dashed line less the diode 11. In the simplest case the primary-sided differential member includes a capacitor 5 connected across the current path, and a resistor 6 which is connected in parallel with the primary winding 8. A terminal 3 of the secondary winding 9 is connected to the gate electrode G of an n-channel power-FET 12 through a diode 11. The other terminal 4 of the secondary winding 9 is connected to the source electrode S. The drain D of the FET 12 is connected to a voltage $U_B$ over a load 13. The input capacitance $C_G$ of the FET 12 is in the form of a capacitor, the leads of which are shown by a broken line. The load path (emitter-collector path) of a bipolar transistor 14 is connected between the gate electrode G and the source electrode S, and connected in parallel with the input capacitance $C_G$. A capacitor 15 is connected in parallel with the base-emitter path of the transistor 14, one of the connections of the capacitor being connected to the terminal 4 of the secondary winding 9, and to the source electrode S. The other connection of the capacitor 15, which is connected to the base of the transistor 14, is also connected to the secondary winding terminal 3 through a Zener diode 17. Furthermore, a resistor 16 is provided between the gate electrode G and the base connection of the transistor 14. The bipolar transistor 14 can also be interchanged with a p-channel FET. When using the p-channel FET, the latter load path is formed by the source-drain path.

When applying an input voltage $U_e$, e.g. a square-wave pulse, across the input terminals 1, 2, the input voltage $U_e$ is differentiated and appears on the secondary side terminals 3, 4 as an output voltage $U_a$ in the shape of a positive and a negative pulse. The positive pulse arrives at the gate electrode G through the diode 11 and charges up the input capacitance $C_G$. In this way the FET 12 is switched on. Simultaneously the capacitor 15 is charged up through the Zener diode 17. Subsequently the voltage applied across the secondary winding 9 drops and becomes negative because of the decay of the magnetic energy in the transformer. This negative voltage, which drives a current through the resistor 18, is substantially lower than the voltage $U_a$. However, if the potential applied to the terminal 3 reaches a valve, at which the differential produced between the voltage $U_G$ being applied to the capacitance $C_G$ and the aforementioned negative voltage exceeds the Zener voltage of the Zener diode 17, then the Zener diode 17 breaks down and discharges the input capacitance $C_G$ until the voltage differential has dropped below the Zener voltage. With an appropriate selection of the zener voltage, the input capacitance $C_G$ is only discharged to the extent that the FET 12 remains conductive.

Upon an interruption of the input voltage $U_e$, a negative pulse appears at the output terminals 3, 4. This pulse has the magnitude of $-U_a$, so that the voltage, which is now applied to the terminal 3 is equivalent to the sum of voltages $U_a + U_G$. Therefore the Zener diode 17 breaks down, the capacitor 15 is discharged, and the transistor 14 is opened. Now the input capacitance $C_G$ is discharged, and the FET 12 is blocked. Following the decay of the negative pulse at the terminals 3, 4 a positive pulse is generated, which can again be traced back to the decay of the magnetic energy in the transformer 7. This pulse has a low amplitude and is damped by the resistor 18. Using an appropriate dimensioning, it can be damped to the extent of decreasing below the threshold voltages of the diode 11 and the Zener diode 17. In this way the input capacitance cannot be recharged again, and any renewed switching-in of the FET 12 is made impossible.

Figure 3:
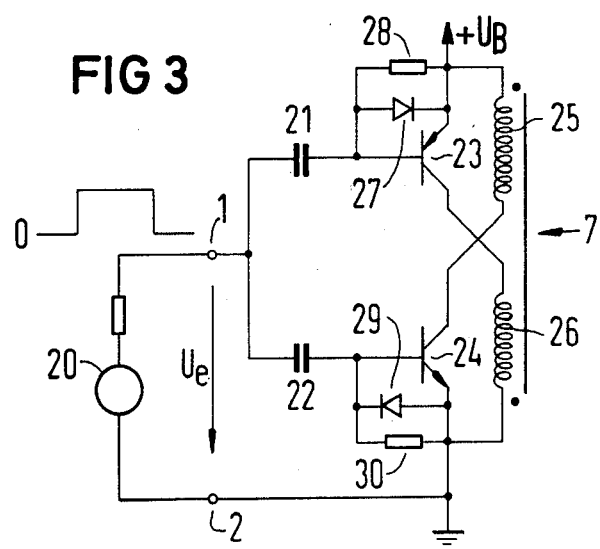
FIG. 3 is a circuit diagram of a modification of the differential member applied to the primary side.

Instead of the simple differential member according to FIG. 2, a primary side driver or exciter stage according to FIG. 3 can be used. For this purpose, the primary winding 8 is subdivided into partial windings 25, 26. The emitter-collector path of a first (pnp) transistor 24 is connected in series with the partial winding 25. The emitter-collector path of a second (npn) transistor 23 is connected in series with the second partial winding 26. The base connections of the transistors 23, 24 are connected to the input terinal 1 through capacitors 21, 22, respectively. The emitter connection of the npn transistor 23 and the start of the partial winding 25 that are marked by a dot are connected to the positive terminal of an operating voltage $U_B$, while the emitter of the pnp-transistor 24 and the start of the partial winding 26 that are marked by a dot are grounded. The second input terminal 2 is grounded as well. There is a voltage source 20 connected to the input terminals 1, 2, supplying square-wave pulses, for example. To avoid any directional effects, a diode 27 is connected antiparallel, and a resistor 28 is connected in parallel, to the emitter-base path of the transistor 23. Accordingly, the transistor 24 is connected to a diode 29 and a resistor 30. The transistor 23 can also be replaced by a p-channel FET and the transistor 24 by an n-channel FET.

When applying the input voltage $U_e$ across the input terminals 1, 2 then $U_e$ is differentiated across the capacitor 22 and opens the transistor 24. In this way a current flow from the voltage $+U_B$ through the first partial winding 25 and the collector-emitter path of the transistor 24 to ground is established. This induces a positive pulse in the secondary winding 9 (shown in FIG. 2) of the transformer 7, the positive pulse being used to open the FET 12, in the way described in conjunction with FIG. 2. Upon an interruption of the input voltage, its trailing edge is differentiated in the capacitor 21 and opens the transistor 23. In this way a current from the voltage $+U_B$ through the transistor 23 and the second partial winding 26 flows to the ground. A negative pulse is thus induced in the secondary winding 9, which negative pulse switches off the FET 12 in the described manner.

Figure 4:
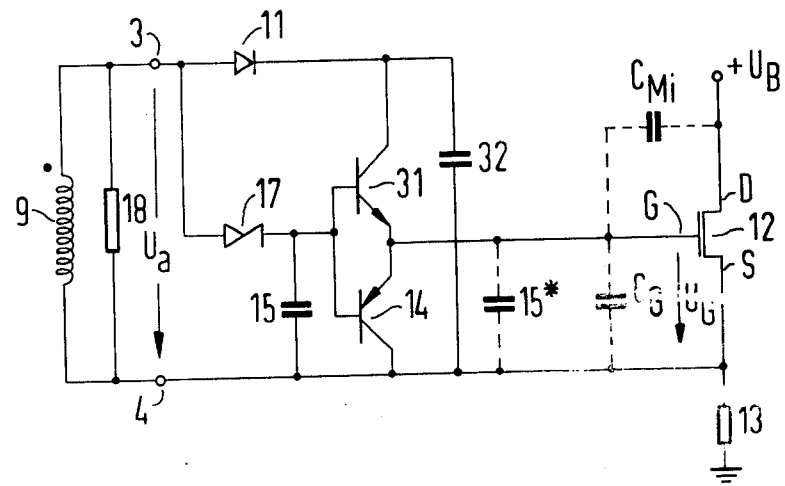
FIG. 4 is a circuit diagram of the secondary side part of a second embodiment of the invention.

The switch 10 can be modified to the extent that the collector-emitter path of a further transistor 31 is connected inbetween the diode 11 and the gate electrode of the FET 12, as shown in FIG. 4. The transistor 31 is an npn-transistor and it is coupled with the pnp-transistor 14 to produce a complementary emitter follower circuit. A capacitor 32 is connected in parallel with the collector-emitter paths of the transistors 31 and 14. This circuit is advantageous, especially in cases where positive and negative interference pulses produced by high dv/dt loadings arrive at the gate electrode of the FET 12 through a Miller capacitance $C_{Mi}$ being applied between the drain connection D and the gate electrode G. If these interferences are of a sufficient magnitude, they can switch the FET 12 on and off regardless of the application of an input voltage. If a positive interference pulse now arrives at the gate electrode G through the Miller capacitance, then the transistor 14 is opened to a minor extent, and the interference pulse is short-circuited through the capacitor 15. With a negative interference pulse, the transistor 31 is opened and the interference pulse is equally short-circuited through the capacitor 15. The special advantage in this case is that the capacitor 15 acts as if a capacitor 15* being amplified by the current amplification $\beta$ of the complementary emitter follower, is applied directly between the gate electrode G and the source electrode S. The capacitor 32 is used for supplying the supply voltage for the complementary emitter follower. With each positive current pulse, the capacitor 32 is charged up through the diode 11. The complementary emitter follower can also be replaced by a complementary source follower including an n-channel FET and a p-channel FET.

Figure 5:
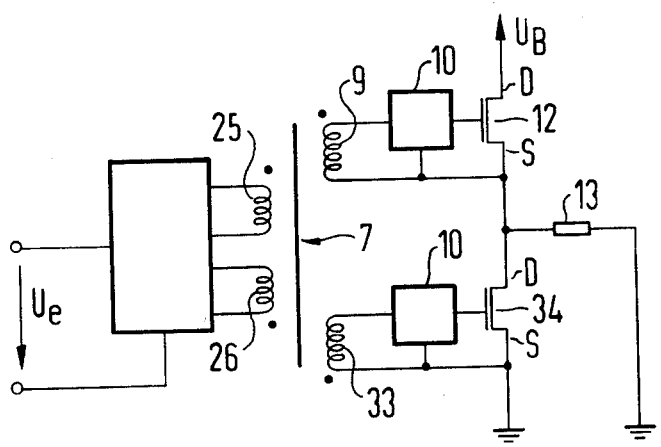
FIG. 5 is a circuit diagram of a changeover switch, with which the embodiment according to FIG. 2 or 4 can be used on the secondary side.

Based on the circuits according to FIG. 2, 3 or 4, a changeover or reversal switch can also be assembled as shown in FIG. 5. The changeover switch can contain a switch 10 according to FIG. 2 or FIG. 4. In series connection with the FET 12 there is a second FET 34, the source electrode of the FET 12 being interconnected with the drain electrode of the FET 34. The load 13 is applied on one side to ground and on the other side to the point of interconnection between the FETs 12 and 34. The transformer 7 on the secondary side, applying an input voltage to the secondary winding 9, supplies a positive pulse, and applying an input voltage to the secondary winding 33 supplies a negative pulse. Thus the FET 12 is switched in and the FET 34 is switched off, as long as the latter has not already been blocked. When cutting out the input voltage $U_e$, the secondary winding 9 supplies a negative pulse and the secondary winding 33 supplies a positive pulse, which blocks the FET 12 and makes the FET 34 conductive. The direction of the current through the load 13 then is reversed.

The circuit constructions shown in FIGS. 2, 3 and 4 can also be used for keeping the FET 12 continously switched on. For this purpose, a sequence of square-wave pulses of the magnitude $U_e$ is applied to the input terminals 1, 2. This renders the trailing edges and the negative pulses ineffective so that either the base connection to the transistor 12 is broken by a switch or the base-emitter path is short-circuited. It is also feasible to interrupt the current path by the partial winding 26 or to clip the trailing edge of the input voltage to the extent that the displacement current through the capacitor 21 is not high enough for opening the transistor 23.

Figure 6:
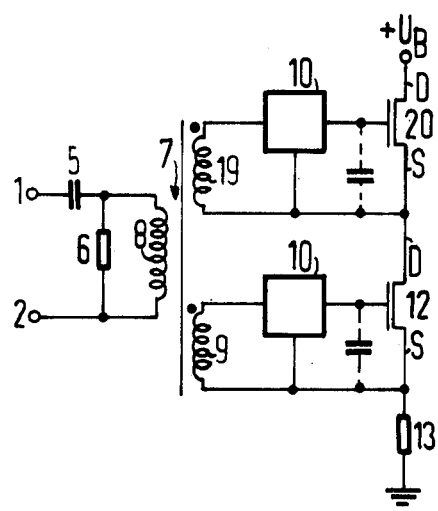
FIG. 6 is a diagram of a circuit for controlling series-connected, source follower-operated FETs.

FIG. 6 shows a circuit for the potential-free controlling of two series-connected power-FETs being operated in the source follower mode. In this case the transformer 7 is provided with two secondary windings 9 and 19 being wound in the same direction and corresponding to the amount of series-connected power-FETs 12 and 20. When applying a positive control pulse to the terminals 1, 2, initially positive control pulses are generated in the secondary windings 9 and 19, the positive pulses simultaneously controlling the power-FETs 12 and 20 through the switches 10 in a conducting manner, as described in conjunction with FIG. 1. Thus the load 13 is effectively applied to the voltage. The negative edge of the input pulse generates negative pulses, which simultaneously discharge the input capacitances of the power-FETs 12 and 20 and in that way block the FETs.

It is feasible to extend the circuit according to FIG. 6 to more than two series-connected FETs. For this purpose the transformer 7 is provided with further secondary windings, which are connected to the gate and source electrodes of further power-FETs. Each winding is connected through a separate switch 10 in the manner described in conjunction with FIG. 2. Thus a potential-free, simultaneous control of all FETs is feasible.

The advantage of a series connection of power-FETs lies in the fact that the maximal blocking voltage as compared with a single power-FET, is multiplied. Though it is possible to construct power-FETs for high blocking voltages $V_{DS}$, these FETs have a high forward resistance in the switched-in state ($R_{DS\,ON}$) because the latter proportionally rises to $V_{DS}^{2.5}$. Using a circuit according to the invention, a multiplication of the blocking voltage can then be attained by an increase in the forward resistance, being only proportional to the amount of FETs.

I claim:

1. Circuit for controlling at least one power-FET, comprising a transformer having a primary and a secondary winding, a control input connected to said primary winding, a first terminal of said secondary winding connected to the gate electrode of the FET, at least one diode connected between said first terminal of said secondary winding and the gate electrode of the FET, a second terminal of said secondary winding connected to the source of the FET, a differential member connected between said control input and said primary winding, and switch means in parallel connection with said at least one diode and connected between said secondary winding and the gate electrode of the FET, said diode operating to connect the gate electrode of the FET to said first terminal of said secondary winding in response to a given secondary signal of a first polarity, and said switch means operating to connect the gate electrode of the FET to the source electrode of the FET and bypassing said diode in response to a given secondary signal of a second polarity.

2. Circuit according to claim 1, wherein said switch means includes a transistor having a load path connected between the gate and the source electrodes of the FET, and a capacitor having one terminal connected to the source electrode of the FET and another terminal connected to the control terminal of said transistor, and a Zener diode connected between said first terminal of said secondary winding and the control terminal of said transistor, said diode and Zener diode being poled in the conducting direction for said secondary signal of the first polarity.

3. Circuit according to claim 2, wherein said switch includes another transistor complementing said first-mentioned transistor, said other transistor having a load path being connected between said diode and the gate electrode of the FET and being connected in series with the load path of said first-mentioned transistor, the control terminals of said transistors being connected to each other, and another capacitor connected in parallel with the series-connected load paths of said transistors.

4. Circuit according to claim 2, wherein said transistor is a bipolar transistor.

5. Circuit according to claim 2, wherein said transistor is an FET.

6. Circuit according to claim 3, wherein said transistors are complementary bipolar transistors being connected as a complementary emitter follower.

7. Circuit according to claim 3, wherein said transistors are complementary FETs being connected as a complementary source follower.

8. Circuit according to claim 1, wherein said control input includes at least one terminal, and said differential member includes two capacitors each having one terminal connected to the same terminal of said control input and each having another terminal, and first and second complementary transistors having base terminals each being connected to a different one of said other terminals of said capacitors and having collector and emitter terminals, said primary winding being subdivided into a first and a second partial winding being wound in mutually opposite directions and each having a start and an end, the start of said first partial winding being connected to the emitter of said first transistor, the start of said second partial winding being connected to the emitter of said second transistor, the end of said first partial winding being connected to the collector of said second transistor, and the end of said second partial winding being connected to the collector of said first transistor.

9. Circuit according to claim 8, wherein said secondary winding of said transformer is subdivided into two partial windings being wound in mutually opposite directions, and the at least one FET is in the form of two series-connected FETs, and including another switch, each of said switches being connected between one of said partial windings and one of the FETs, and a load having a terminal connected to ground and another terminal connected to the drain electrode of one FET and the source electrode of the other FET.

10. Circuit according to claim 1, wherein said secondary winding of said transformer is subdivided into two partial windings being wound in the same direction, and the at least one FET is in the form of two series-connected FETs, and including another switch, each of said switches being connected between one of said partial windings and one of the FETs, and a load connected to the source of the first-mentioned FET.

* * * * *